(12) United States Patent
Schaefer

(10) Patent No.: US 9,311,983 B2
(45) Date of Patent: Apr. 12, 2016

(54) DYNAMICALLY APPLYING REFRESH OVERCHARGE VOLTAGE TO EXTEND REFRESH CYCLE TIME

(71) Applicant: Andre Schaefer, Sassenburg (DE)

(72) Inventor: Andre Schaefer, Sassenburg (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/320,249

(22) Filed: Jun. 30, 2014

(65) Prior Publication Data

US 2015/0380072 A1 Dec. 31, 2015

(51) Int. Cl.
*G11C 7/00* (2006.01)
*G11C 11/406* (2006.01)
*G11C 11/4076* (2006.01)

(52) U.S. Cl.
CPC .......... *G11C 11/406* (2013.01); *G11C 11/4076* (2013.01)

(58) Field of Classification Search
CPC .......................... G11C 11/406; G11C 11/4076

USPC .............................. 365/222, 149, 230.03, 202
See application file for complete search history.

(56) References Cited

U.S. PATENT DOCUMENTS

2004/0246802 A1* 12/2004 Dobler .......................... 365/222
2007/0168781 A1* 7/2007 Sutardja et al. ............... 714/718

* cited by examiner

*Primary Examiner* — Richard Elms
*Assistant Examiner* — Mohammed A Bashar
(74) *Attorney, Agent, or Firm* — Compass IP Law PC

(57) ABSTRACT

A refresh voltage control engine selectively applies different high voltages to use in refresh operations. The control engine can detect that a portion of a memory device needs to be refreshed, and determine that the refresh cycle time is too short for a state of the portion of the memory device. The memory device typically has an associated refresh cycle time or time between refreshes based on the device and system architecture. The control engine can generate one or more control signals to cause the system to apply an overcharge refresh to overcharge the portion of the memory device with a refresh operation to extend the refresh cycle time for the portion of the memory device.

20 Claims, 5 Drawing Sheets

DYNAMICALLY APPLYING REFRESH OVERCHARGE VOLTAGE TO EXTEND REFRESH CYCLE TIME

FIELD

Embodiments of the invention are generally related to memory devices, and more particularly to dynamically, selectively applying a refresh overcharge voltage to extend refresh cycle time.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2014, Intel Corporation, All Rights Reserved.

BACKGROUND

Memory devices are ubiquitous in computing devices to store data and code for a processor to execute operations and accomplish the function of the computing devices. Even as the demand for computing devices grows, there is a trend towards smaller computing devices that operate from lower and lower supply voltages. Current memory technologies have been able to continue to scale with the decreasing feature size and decreasing high voltage levels. However, despite being able to produce memory devices with smaller feature sizes, there is still a threshold voltage (Vt) required to access a memory cell, which does not scale with the change in feature size. Thus, the ratio of transistor threshold voltage to supply voltage (Vsu) continues to increase, resulting in shorter cell charge refresh cycle times (based on traditional leakage models). While it is possible to create devices with different leakage models, the cost of such devices makes such an approach impractical.

Shorter refresh cycle time means that a system has to perform more frequent refreshes to maintain state in volatile memories. Requiring more frequent refresh can actually increase power usage in the system, despite lower supply voltages and smaller feature sizes. Additionally, increasing the frequency of refreshing as memory sizes continue to increase poses the possibility that a memory device will be constantly refreshing something. Access to a portion of a memory device that is being refreshed is restricted. Thus, the increased frequency of refreshing will have a negative impact on memory access performance.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
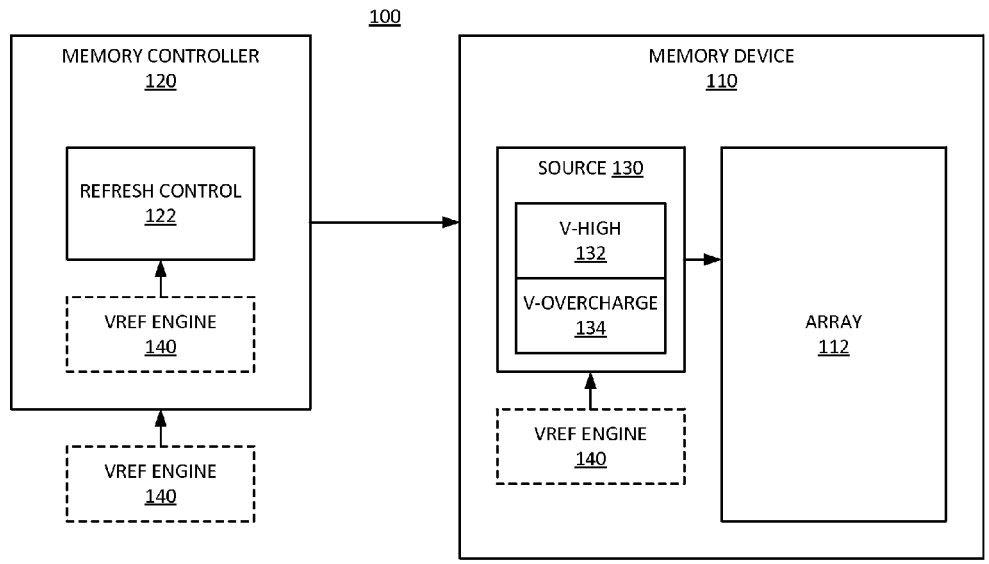
FIG. 1 is a block diagram of an embodiment of a system that applies refresh overcharging to extend a refresh cycle time.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a memory subsystem includes a refresh voltage control engine to selectively apply different high voltages to use in refresh operations. It will be understood that volatile memory devices need to be refreshed to maintain a deterministic state. If power is interrupted to a volatile memory device, the state of the data in the memory device is non-deterministic. In contrast, a nonvolatile memory maintains state even in the event that power is interrupted to the device. In a system that includes a volatile memory device, the system will include control logic to manage the refresh operations of the memory device. The control logic can be part of a memory controller or comparable circuit or component, or can be part of a standalone circuit. The refresh voltage control engine can be part of the memory device itself and/or part of a memory controller or other memory management control circuitry. It will be understood that a memory device typically has an associated refresh cycle time (tREF), which is determined by memory device architecture and/or system architecture. tREF refers to the time between refresh operations for a particular portion the memory device. It will be understood that each portion of the volatile memory must be refreshed within tREF to maintain state.

The control engine can detect that a portion of a memory device needs to be refreshed, and determine that the tREF is too short for the portion of the memory device. In one embodiment, the memory device is one of multiple memory devices in the system. In one embodiment, the portion of the memory device is one of multiple portions for the memory device. The portion of the memory device may be associated with a particular state or condition that affects what tREF is needed. For example, in a low power or sleep mode or state, the frequency of refreshing can consume significant power. In another example, for a portion of the memory device that holds critical system data, the system may benefit from less frequent refreshes of that portion. In another example, a portion the memory device that holds most heavily used data may not need to be refreshed as frequently, and could allow the use of a selectively extended refresh cycle time.

The control engine can generate one or more control signals to cause the system to apply an overcharge refresh to overcharge the portion of the memory device with a refresh operation. An overcharge refresh refers to a refresh operation that uses a Vblh that is higher than what is used for standard access operations during active mode. By selectively overcharging the portion of the memory device, the system can selectively extend the refresh cycle time for the portion of the memory device. Thus, the system can dynamically modify the system architecture related to tREF by applying a higher voltage to the portion of the memory device. Even assuming traditional leakage models, when more charge is put into a memory cell it will hold sufficient charge for a longer period of time. Thus, instead of using the standard tREF associated with the memory device, the system can dynamically adjust refresh time for one or more refresh cycles on a per-portion basis.

In one embodiment, the system selectively applies extension of refresh cycle time to different refresh modes. For example, the system can apply refresh overcharging to a self-refresh mode (SRF), a partial SRF mode, an auto-refresh mode (ARF), and/or other refresh modes. It will be understood that selective refresh overcharging is compatible with the use of error correction codes (ECCs) and/or other protection modes.

FIG. 1 is a block diagram of an embodiment of a system that applies refresh overcharging to extend a refresh cycle time. System 100 illustrates portions of a memory subsystem of a computing device. System 100 includes volatile memory device 110 and memory controller 120. Memory device 110 can be, for example, a dynamic random access memory (DRAM) or other memory device. Memory device 110 has an associated refresh cycle time. Memory controller 120 represents a control circuit or control logic that manages access to memory device 110 and refreshing of the memory device.

Memory device 110 includes array 112, which represents an array of memory cells or memory bits. Typically array 112 is organized and managed as multiple rows of memory. In one embodiment, array 112 includes many memory cells, each between a wordline and a bitline. To refresh the memory cell, the memory device activates the memory cell, by applying a voltage differential between the bitline and the wordline. In one embodiment, in normal operation memory device 110 operates from a particular supply voltage, referred to as Vsu, which might be fairly close to the threshold voltage of the memory cell transistors of array 112. Memory device 110 applies the supply voltage to the bitline as the bitline high voltage, referred to as Vblh, for access operations.

Memory controller 120 includes refresh control 122, which represents control logic that manages during active operation what blocks or portions of array 112 to refresh at what points in time. Refresh control 122 generates refresh commands to send to memory device 110. The refresh commands identify address information to cause memory device 110 to refresh the identified portions of the memory. In lower power modes, memory device 110 manages the refreshing, thus determining what to refresh and when.

System 100 includes refresh voltage (VREF) engine 140, which manages what voltage to use for refresh operations in memory device 110. In one embodiment, engine 140 is completely or partially included within memory device 110. In one embodiment, engine 140 is completely or partially included within memory controller 120. In one embodiment, engine 140 exists in whole or in part outside of memory controller 120 and memory device 110, such as within other control logic within the memory subsystem. Engine 140 determines what portion or portions of memory device 110 should be overcharged during a refresh operation, as well as determining when to execute an overcharge refresh. An overcharge refresh refers to a refresh operation that uses a Vblh that is higher than what is used for standard access operations during active mode.

Selectively increasing the Vblh for certain refresh operations can overcharge a memory cell capacitor, which will extend the refresh time. Engine 140 can determine to apply overcharging refresh operations for performance modes, power saving modes, self-refresh modes, and/or pseudo-nonvolatile modes (e.g., a power down or deep sleep mode) for the memory subsystem. By selectively increasing the Vblh only for certain refresh operations, system 100 can achieve the benefit of having a lower voltage swing during normal operation, resulting in lower operational power consumption, while achieving significant effort reduction and system performance gain (e.g., by reducing ARF sequencing and/or SRF power consumption in certain modes or states of the memory).

It will be understood that while engine 140 is illustrated and described as providing selective control over what portion or portions of memory device 110 to refresh with an overcharge voltage, memory controller 120 typically controls the refresh operation of memory device 110 (via refresh control logic 122). Engine 140 can determine which refreshes to boost, and then return to normal or standard refresh operations. In one embodiment, memory controller 120 provides a refresh command to memory device 110 to cause the memory device to execute the refresh operation. In one embodiment, memory controller 120 simply issues normal refresh operations, and engine 140 at memory device 110 determines when to use refresh overcharging. In one embodiment, memory controller 120 generates a refresh overcharge command, which memory device 110 interprets differently than standard refresh commands. For example, memory controller 120 can generate control signals from which memory device 110 operates in response to the refresh overcharge command. The control signals by engine 140 enable memory device 110 to execute an overcharge refresh operation. In one embodiment, memory controller 120 issues a standard refresh operation, and engine 140 generates control signals (e.g., an engine in memory controller 120 or one external to memory controller 120) to control what voltage will be applied to the bitlines of array 112.

System 100 illustrates source 130 within memory device 110. Source 130 represents voltage levels that can be applied to the bitlines of array 112 for refresh operations. In one embodiment, Vhigh 132 represents a high voltage for normal operation, and Vovercharge 134 represents a high voltage for a refresh operation that overcharges the memory cell(s) of a portion of the memory device. In accordance with what is stated above, in one embodiment, all voltages of source 130 are generated within memory device 110 from a power supply signal received at the memory device. In one embodiment, one or more voltages of source 130 are provided from a voltage source external to memory device 110 (not specifically shown). Thus, for example, memory device 110 can have a high voltage input for memory access operations, and the supply to such a pin or input can be dynamically changed for specific refresh operations.

Figure 2:
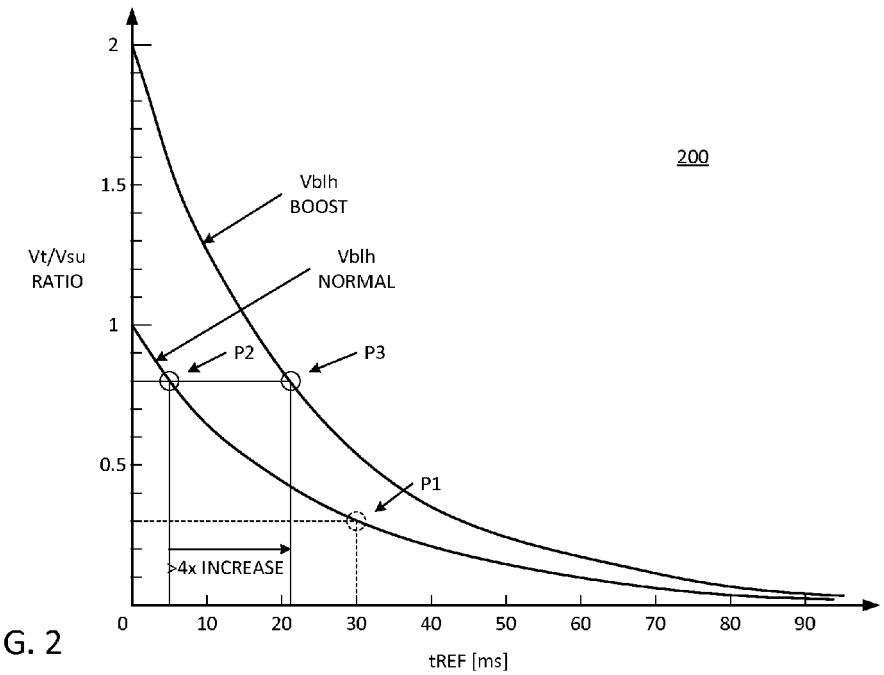
FIG. 2 is a diagram representing an embodiment of a relationship between a ratio of threshold voltage to voltage supply versus refresh cycle time.

FIG. 2 is a diagram representing an embodiment of a relationship between a ratio of threshold voltage to voltage supply versus refresh cycle time. Diagram 200 shows behavior of a memory device (such as memory device 110 of system 100) due to leakage in the memory cells of the memory device. Consider first the curve labeled Vblh normal, which represents the leakage behavior of a memory cell when a normal or standard supply voltage is applied during refresh. Considering the curves from left to right, the Vblh normal curve starts at a ratio Vt/Vsu=1, which would not allow the device to hold state. The curve falls off exponentially, where lower and lower ratios of Vt/Vsu extend the refresh cycle time further and further. For example, current systems have a ratio of approximately 0.3, which corresponds to approximately a 30 millisecond tREF, as shown at point P1. Point P2 represents the direction of proposed and future memory technologies, where the ratio of Vt/Vsu is closer to 0.8. Such a ratio provides a tREF of approximately 5 ms.

It will be understood that as feature size decreases, the supply voltage for the memory devices also decreases, but the threshold voltage is nearly the same. Thus, the memory subsystem will need to refresh the memory device more and more frequently (the inverse of the curves illustrated). When the frequency of refresh is high enough, despite lower voltages and smaller feature size, the increase in refreshes will increase power usage. Consider the curve labeled Vblh boost, which represents the leakage behavior of the same memory cell of the curve Vblh normal, but having been boosted to an overcharge voltage in a refresh operation. It will be observed that the curve Vblh boost starts with double the initial ratio (and so starts at 2 instead of 1). It will be observed that the curve falls off faster than the normal curve. However, at point P3, it can be seen that the increase in Vblh increases the refresh cycle time by greater than a factor of four.

While diagram 200 shows a boost or overcharge ratio at twice the ratio for a normal refresh operation, the ratio increase can be any factor, including factors that are not whole numbers (for example, a ratio increase by 1.5× (a factor of 1.5)). The ratio can be increased by increasing Vblh by the desired factor. Vsu can be understood as the bitline high voltage. In one embodiment, to justify the increase in power required to increase the ratio, the refresh cycle time should be extended by at least the square of the factor increase in the ratio. For example, in diagram 200, the ratio of Vt/Vsu increases by a factor of 2, and tREF increases by more than a factor of 4. Such an increase makes sense in light of the fact that power increases as the square of the voltage.

Figure 3:
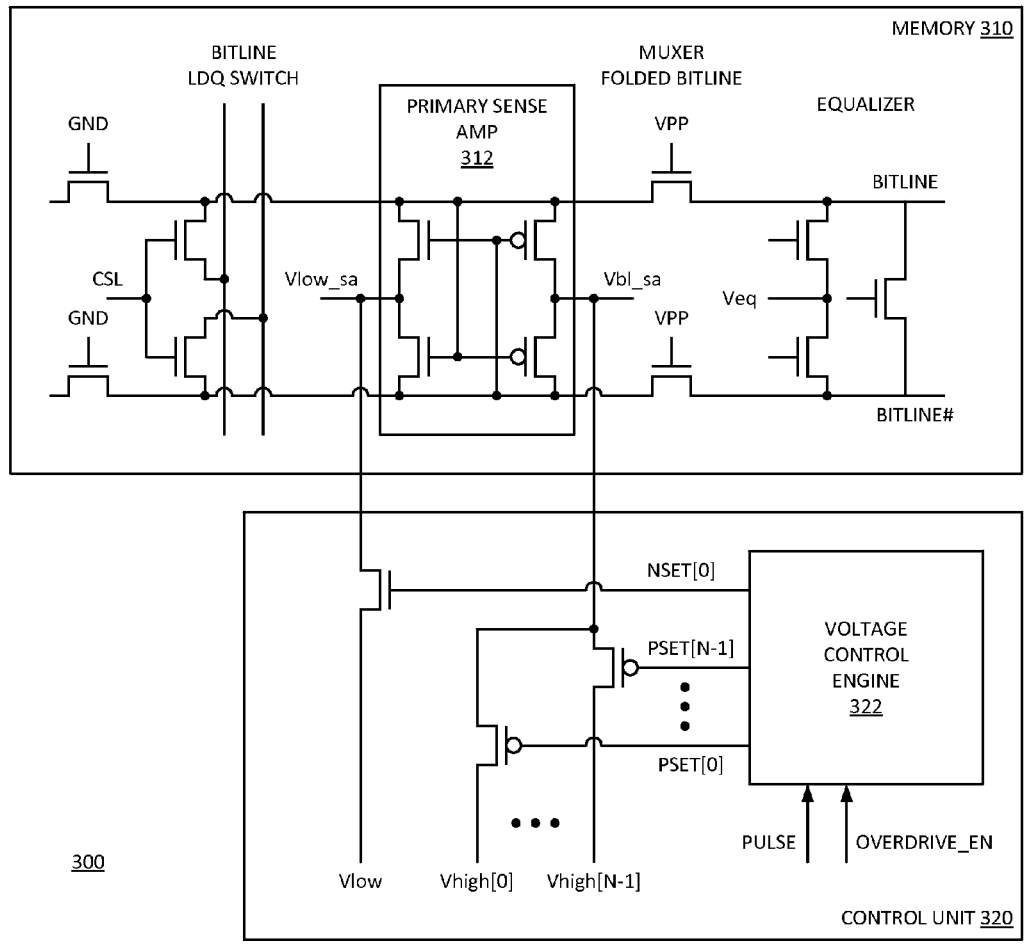
FIG. 3 is a block diagram of an embodiment of a system that provides refresh overcharging.

FIG. 3 is a block diagram of an embodiment of a system that provides refresh overcharging. System 300 can be one example of elements of a memory subsystem in accordance with system 100 of FIG. 1 and/or diagram 200 of FIG. 2. System 300 includes memory device 310, which is a volatile memory device that performs refresh operations to maintain deterministic state. Memory 310 is illustrated by a folded bitline architecture. It will be understood that an open structure architecture could alternatively be used. In the folded bitline architecture, both the bitline (BL) and the inverted bitline (BL#) are controlled by the same control signals. In an open architecture, BL and BL# can be controlled by different control signals.

Referring to the architecture illustrated, it will be understood that BL and BL# can be controlled by an equalizer for precharging the bitline. The precharge can be engaged for a page Activate operation, which opens selected devices to control the addressed memory cell(s). The muxer folded bitline circuit can operate as a transfer gate, and can be controlled by a voltage reference signal VPP. In one embodiment, a column select line (CSL) signal operates to determine which bitline is selected to activate for the access operation, and thus controls the bitline local data (LDQ) switch. The local data can refer to an architecture in which there is a local bitline and a global bitline, as is understood in the art.

Primary sense amplifier 312 illustrates a sense amplifier that can be used in the refresh operation. Sense amplifier 312 can be understood as a circuit in memory 310 that controls the refresh behavior of memory cells within the memory device. In one embodiment, sense amplifier 312 receives low voltage and high voltage control signals from control unit 320. It will be understood that the differences between n-type and p-type devices will provide a staggered N and P behavior. Thus, Vlow_sa and Vbl_sa will trigger at different times. Vlow_sa is a low voltage reference for sense amplifier 312, and Vbl_sa is a bitline high voltage reference. By applying Vbl_sa to the bitline, system 300 can charge a memory cell for a refresh operation.

In system 300, the value of Vbl_sa can be dynamically selected by control unit 320. Voltage control engine 322 represents control logic in control unit 320 that enables the control unit to select different voltage levels to apply to Vbl_sa during refresh operations. Engine 322 can be implemented as a hardware control logic unit or as part of larger controller. In one embodiment, control unit 320 is part of a memory controller that controls the refresh operations of memory 310. Thus, the memory controller can have access to the voltage levels of sense amplifier 312. In one embodiment, at least a portion of control unit 320, or all of control unit 320, is part of memory 310. In one embodiment, engine 322 is a state machine in system 300. For example, engine 322 can be a state machine in a memory controller. Alternatively, engine 322 can be executed in or controlled or invoked by another part of a memory subsystem and/or a central processing unit or system on a chip. The refresh high voltage control can be part of a larger power control engine within a system of which memory 310 is a part.

In one embodiment, engine 322 can set Vlow_sa to a value of Vlow by a control signal (indicated as NSET[0] in system 300). Since Vlow is not a dynamically changing value, in one embodiment engine 322 sends command signal NSET[0] to memory 310, which has control logic that connects Vlow_sa to a local Vlow reference. In one embodiment, engine 322 generates one or more control signals PSET[n] to provide a high voltage reference to Vbl_sa for sense amplifier 312. In one embodiment as shown in system 300, there is a one-to-one relationship between control signal lines and high voltage selection switches. In another embodiment, such a one-to-one relationship is not necessary. Engine 322 can determine what high voltage to use for Vbl based on the inputs labeled Pulse and Overdrive_enable. The Pulse input can indicate a ROW active pulse and/or an ARF pulse. The Overdrive_enable signal can indicate whether to enable the use of an overdrive voltage during Activate and/or ARF operation. In one embodiment, the input signals are provided to engine 322 by a memory controller or equivalent. Thus, a memory controller could provide the control signals to control unit 320 located on memory 310, which can then locally implement the application of an overdrive voltage to sense amplifier 312.

In one embodiment, control unit 320 includes N different high voltages that can be selected to provide to Vbl_sa. In such an embodiment, Vhigh[0] can be understood as a standard operating voltage for normal operation within memory 310. All other high voltages can be overdrive voltage levels that can be selectively applied to sense amplifier 312 for refresh operations. In one embodiment, the different high voltage levels are provided to memory 310 from outside the memory device. In another embodiment, memory 310 receives control signals to apply different high voltage levels generated internally to the memory device. The different switches that select the high voltage to apply for refresh operations can be understood as a high voltage selection circuit. In a simple implementation (as illustrated), the selection circuit can involve several switches controlled by different control signals. In one embodiment, the selection circuit can be an analog multiplexer or other selection circuitry.

In one embodiment, N=2. Thus, under normal operation system 300 can apply Vhigh[0] to sense amplifier 312, and under an overdrive condition, system 300 can apply Vhigh[1] to overcharge the memory cell for certain refresh operations. In one embodiment, N is greater than 2, and engine 322 can determine what voltage to apply, given the specific state or condition of the memory device. For example, one overdrive voltage could be used for refreshes for a portion of memory device 310 that stores critical data, and another different overdrive voltage could be used for a portion of memory device 310 for refreshes in a deep sleep state. Other implementations are possible. Thus, control unit 320 can select and switch one of multiple different high voltages to the bitline high voltage for a portion of memory device 310 for refresh operations.

Figure 4:
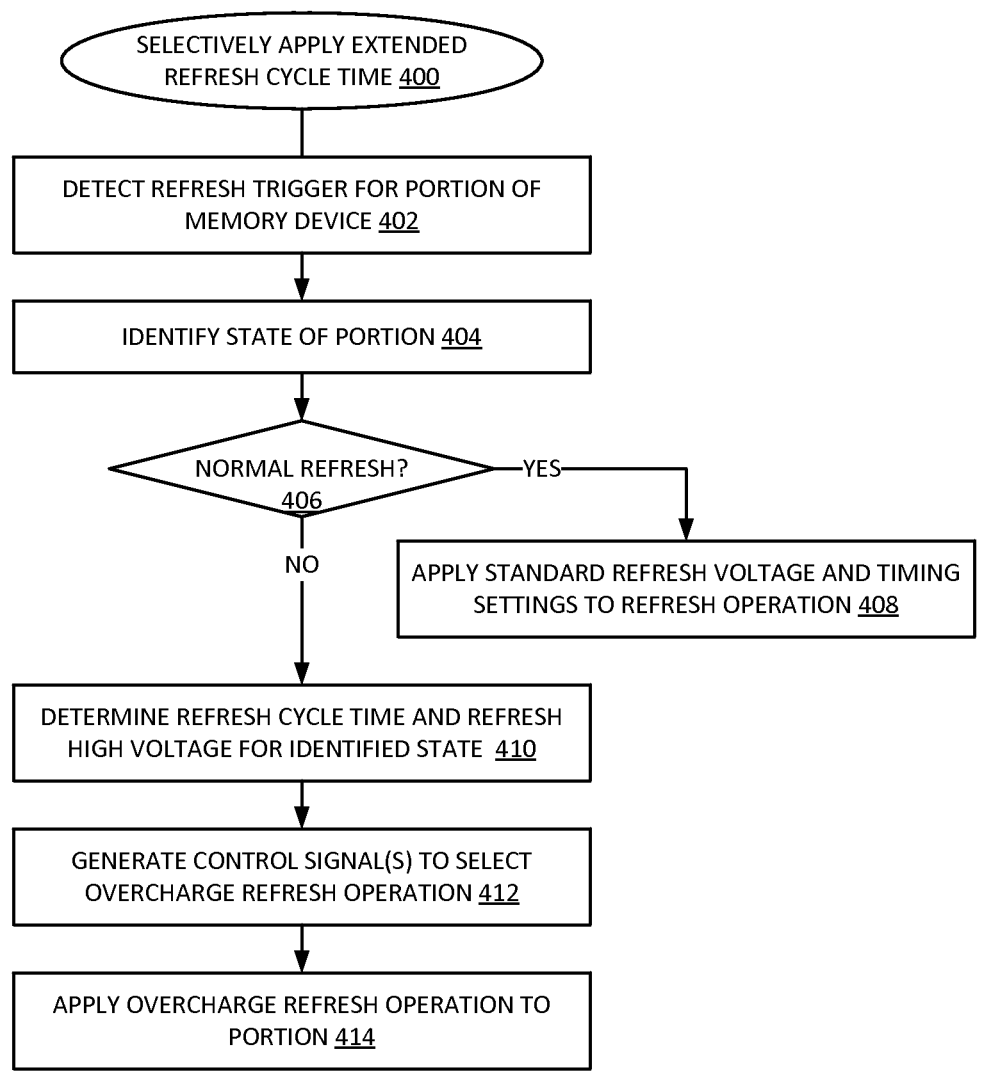
FIG. 4 is a flow diagram of an embodiment of a process for selectively applying an extended refresh cycle time.

FIG. 4 is a flow diagram of an embodiment of a process for selectively applying an extended refresh cycle time. Process 400 describes certain operations for a system selectively applying an extended refresh cycle time (tREF) for refresh operations. The system applies an extended tREF by applying an overcharge or boost voltage to a memory cell for a refresh operation.

In one embodiment, control logic that manages refreshes (e.g., a memory controller) detects a refresh trigger that indicates a portion of a memory device should be refreshed, 402. Such a trigger can be a timer or state machine or other mechanism used to determine when to refresh a particular portion of a memory device. The portion can be a line, a page, a block, or another section of a memory device. In one embodiment, the control logic determines that a section of memory needs to be refreshed, and then proceeds to generate multiple refresh operations to refresh each line of the section. The control logic can cause an overcharge refresh operation to be applied to one section and not another.

In one embodiment, the control logic or a refresh control engine identifies a state of the portion of the memory to be refreshed, 404. As used here, "state" refers to an operating mode of the memory device (e.g., sleep mode or active mode), a type of data stored in the portion (e.g., critical data (e.g., system or control data) versus normal data (e.g., application data), heavily used or frequently accessed data versus less frequently used data), or other condition or state of the memory device that can identify a section that should have a longer refresh cycle time. Based on the state of the portion, the control logic determines whether to apply a normal refresh operation to the portion, 406. The control logic will determine to apply an overcharge refresh operation when the standard refresh time is too short for the identified state. If the control logic determines to apply a normal refresh operation, 406 YES branch, the system applies a standard refresh voltage and timing settings to the refresh operation for the portion, 408. If a standard refresh high voltage is used, the system will need to refresh the portion within a standard tREF.

If the control logic determines to not use a normal refresh operation, 406 NO branch, the control logic can determine a refresh cycle time to apply for the refresh operation, 410. The selected or determined refresh cycle time will have an associated refresh high voltage for the identified state of the portion. In one embodiment, there is a refresh overcharge voltage the system can apply to the portion. In one embodiment, there are multiple different refresh overcharge voltages the system can apply, and the system applies one that best matches the identified state. Thus, the refresh voltage engine can include determination logic, such as heuristic algorithms, state machines, matching algorithms, search algorithms, or other logic, to determine which of multiple different high voltages to apply for a given refresh operation.

The refresh voltage engine generates one or more control signals to select an overcharge voltage to use in an overcharge refresh operation, 412. The engine sends controls and/or voltages to the memory device, which then applies the overcharge refresh operation to the selected portion of the memory device, 414. In one embodiment, the system applies an overcharge refresh voltage from external to the memory device. In one embodiment, the memory device internally generates the overcharge refresh voltage to be used, in response to a command or control signal from external to the memory device.

Figure 5:
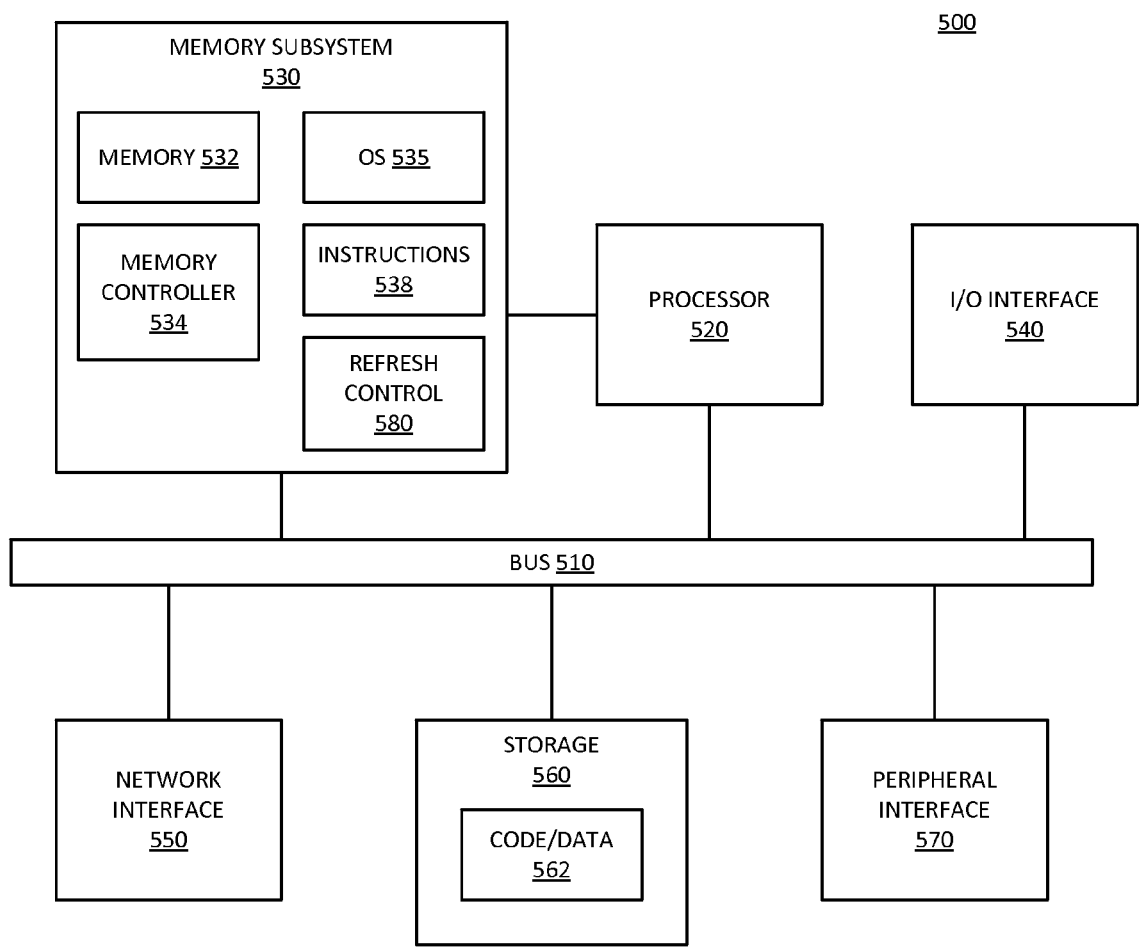
FIG. 5 is a block diagram of an embodiment of a computing system in which refresh overcharging to extend a refresh cycle time can be implemented.

FIG. 5 is a block diagram of an embodiment of a computing system in which refresh overcharging to extend a refresh cycle time can be implemented. System 500 represents a computing device in accordance with any embodiment described herein, and can be a laptop computer, a desktop computer, a server, a gaming or entertainment control system, a scanner, copier, printer, routing or switching device, or other electronic device. System 500 includes processor 520, which provides processing, operation management, and execution of instructions for system 500. Processor 520 can include any type of microprocessor, central processing unit (CPU), processing core, or other processing hardware to provide processing for system 500. Processor 520 controls the overall operation of system 500, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 530 represents the main memory of system 500, and provides temporary storage for code to be executed by processor 520, or data values to be used in executing a routine. Memory subsystem 530 can include one or more memory devices such as read-only memory (ROM), flash memory, one or more varieties of random access memory (RAM), or other memory devices, or a combination of such devices. Memory subsystem 530 stores and hosts, among other things, operating system (OS) 536 to provide a software platform for execution of instructions in system 500. Additionally, other instructions 538 are stored and executed from memory subsystem 530 to provide the logic and the processing of system 500. OS 536 and instructions 538 are executed by processor 520. Memory subsystem 530 includes memory device 532 where it stores data, instructions, programs, or other items. In one embodiment, memory subsystem includes memory controller 534, which is a memory controller to generate and issue commands to memory device 532. It will be understood that memory controller 534 could be a physical part of processor 520.

Processor 520 and memory subsystem 530 are coupled to bus/bus system 510. Bus 510 is an abstraction that represents any one or more separate physical buses, communication lines/interfaces, and/or point-to-point connections, connected by appropriate bridges, adapters, and/or controllers. Therefore, bus 510 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 510 can also correspond to interfaces in network interface 550.

System 500 also includes one or more input/output (I/O) interface(s) 540, network interface 550, one or more internal mass storage device(s) 560, and peripheral interface 570 coupled to bus 510. I/O interface 540 can include one or more interface components through which a user interacts with system 500 (e.g., video, audio, and/or alphanumeric interfacing). Network interface 550 provides system 500 the ability to communicate with remote devices (e.g., servers, other computing devices) over one or more networks. Network interface 550 can include an Ethernet adapter, wireless interconnection components, USB (universal serial bus), or other wired or wireless standards-based or proprietary interfaces.

Storage 560 can be or include any conventional medium for storing large amounts of data in a nonvolatile manner, such as one or more magnetic, solid state, or optical based disks, or a combination. Storage 560 holds code or instructions and data 562 in a persistent state (i.e., the value is retained despite interruption of power to system 500). Storage 560 can be generically considered to be a "memory," although memory 530 is the executing or operating memory to provide instructions to processor 520. Whereas storage 560 is nonvolatile, memory 530 can include volatile memory (i.e., the value or state of the data is indeterminate if power is interrupted to system 500).

Peripheral interface 570 can include any hardware interface not specifically mentioned above. Peripherals refer generally to devices that connect dependently to system 500. A dependent connection is one where system 500 provides the software and/or hardware platform on which operation executes, and with which a user interacts.

In one embodiment, system 500 includes refresh control 580 in memory subsystem 530. Refresh control 580 represents logic for performing a refresh operation in accordance with any embodiment described, and may be or include a refresh voltage control engine. In one embodiment, refresh control 580 can include logic to determine when to apply an overcharge refresh operation, and/or logic to select a voltage to apply to a bitline of a memory cell being refreshed. In one embodiment, refresh control 580 is part of memory controller 534. In one embodiment, refresh control 580 is part of memory device 532. In one embodiment, both memory 532 and memory controller 534 include elements of refresh control 580. Refresh control 580 allows system 500 to selectively apply an overcharge or boost voltage to a section or portion of memory 532 on a portion-by-portion basis and on a refresh-by-refresh basis or a system state basis.

Figure 6:
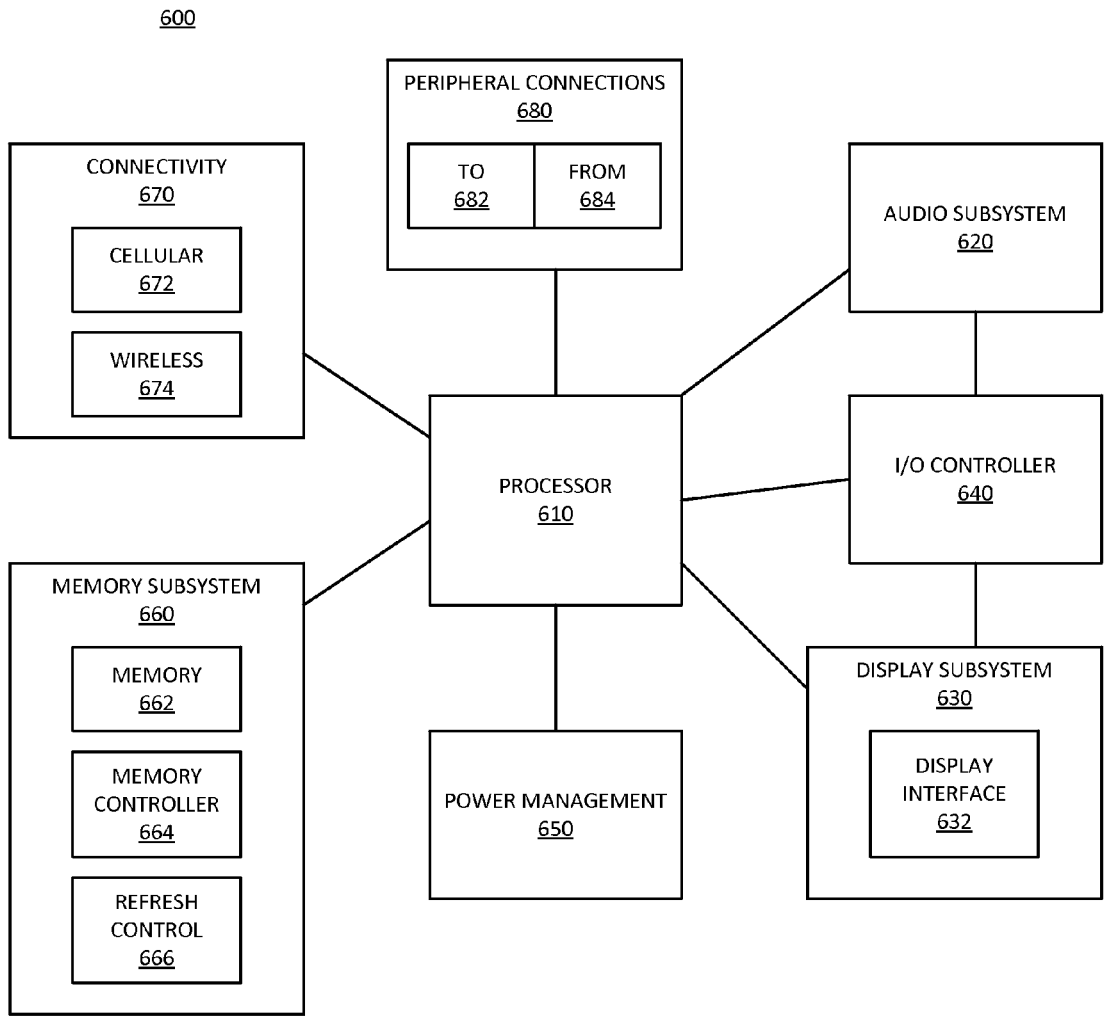
FIG. 6 is a block diagram of an embodiment of a mobile device in which refresh overcharging to extend a refresh cycle time can be implemented.

FIG. 6 is a block diagram of an embodiment of a mobile device in which refresh overcharging to extend a refresh cycle time can be implemented. Device 600 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 600.

Device 600 includes processor 610, which performs the primary processing operations of device 600. Processor 610 can include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting device 600 to another device. The processing operations can also include operations related to audio I/O and/or display I/O.

In one embodiment, device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 600, or connected to device 600. In one embodiment, a user interacts with device 600 by providing audio commands that are received and processed by processor 610.

Display subsystem 630 represents hardware (e.g., display devices) and software (e.g., drivers) components that provide a visual and/or tactile display for a user to interact with the computing device. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touchscreen device that provides both output and input to a user. In one embodiment, display subsystem 630 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others.

I/O controller 640 represents hardware devices and software components related to interaction with a user. I/O controller 640 can operate to manage hardware that is part of audio subsystem 620 and/or display subsystem 630. Additionally, I/O controller 640 illustrates a connection point for additional devices that connect to device 600 through which a user might interact with the system. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of device 600. Additionally, audio output can be provided instead of or in addition to display output. In another example, if display subsystem includes a touchscreen, the display device also acts as an input device, which can be at least partially managed by I/O controller 640. There can also be additional buttons or switches on device 600 to provide I/O functions managed by I/O controller 640.

In one embodiment, I/O controller 640 manages devices such as accelerometers, cameras, light sensors or other environmental sensors, gyroscopes, global positioning system (GPS), or other hardware that can be included in device 600. The input can be part of direct user interaction, as well as providing environmental input to the system to influence its operations (such as filtering for noise, adjusting displays for brightness detection, applying a flash for a camera, or other features). In one embodiment, device 600 includes power management 650 that manages battery power usage, charging of the battery, and features related to power saving operation.

Memory subsystem 660 includes memory device(s) 662 for storing information in device 600. Memory subsystem 660 can include nonvolatile (state does not change if power to the memory device is interrupted) and/or volatile (state is indeterminate if power to the memory device is interrupted) memory devices. Memory 660 can store application data, user data, music, photos, documents, or other data, as well as system data (whether long-term or temporary) related to the execution of the applications and functions of system 600. In one embodiment, memory subsystem 660 includes memory controller 664 (which could also be considered part of the control of system 600, and could potentially be considered part of processor 610). Memory controller 664 includes a scheduler to generate and issue commands to memory device 662.

Connectivity 670 includes hardware devices (e.g., wireless and/or wired connectors and communication hardware) and software components (e.g., drivers, protocol stacks) to enable device 600 to communicate with external devices. The external device could be separate devices, such as other computing devices, wireless access points or base stations, as well as peripherals such as headsets, printers, or other devices.

Connectivity 670 can include multiple different types of connectivity. To generalize, device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 674 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (e.g., downloading and/or uploading, changing, synchronizing) content on device 600. Additionally, a docking connector can allow device 600 to connect to certain peripherals that allow device 600 to control content output, for example, to audiovisual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, system 600 includes refresh control 666 in memory subsystem 660. Refresh control 666 represents logic for performing a refresh operation in accordance with any embodiment described, and may be or include a refresh voltage control engine. In one embodiment, refresh control 666 can include logic to determine when to apply an overcharge refresh operation, and/or logic to select a voltage to apply to a bitline of a memory cell being refreshed. In one embodiment, refresh control 666 is part of memory controller 664. In one embodiment, refresh control 666 is part of memory device 662. In one embodiment, both memory 662 and memory controller 664 include elements of refresh control 666. Refresh control 666 allows system 600 to selectively apply an overcharge or boost voltage to a section or portion of memory 662 on a portion-by-portion basis and on a refresh-by-refresh basis or a system state basis.

In one aspect, a method for managing memory device refresh includes: detecting that a portion of a memory device needs to be refreshed, the memory device having an associated time between refreshes; determining that the time between refreshes is too short for a state of the portion of the memory device; and applying an overcharge refresh to overcharge the portion of the memory device with a refresh operation to extend the time between refreshes for the portion of the memory device.

In one embodiment, determining that the time between refreshes is too short for the state comprises determining that the memory device is in a low power state. In one embodiment, determining that the time between refreshes is too short for the state comprises determining that the portion of the memory device stores data designated to have a longer time between refreshes. In one embodiment, applying the overcharge refresh for the portion of the memory device comprises applying the overcharge refresh for the portion of the memory device, but not for another portion of the same memory device. In one embodiment, applying the overcharge refresh further comprises sending an overcharge refresh command from a memory controller to the memory device, wherein the memory device receives an external overcharge refresh voltage for the refresh operation. In one embodiment, applying the overcharge refresh further comprises sending an overcharge refresh command from a memory controller to the memory device, wherein the memory device generates an overcharge refresh voltage for the refresh operation. In one embodiment, applying the overcharge refresh for the portion of the memory device further comprises setting time between refreshes for auto refresh operations. In one embodiment, applying the overcharge refresh for the portion of the memory device further comprises performing the refresh operation with one of multiple different levels of overcharge refresh voltage.

In one aspect, an apparatus for dynamically applying a refresh voltage includes: control logic to detect that a portion of a memory device needs to be refreshed, determine that a time between refreshes is too short for a state of the portion of the memory device, and generate control signals to circuits that control refresh to cause the circuits to overcharge the portion of the memory device with a refresh operation to extend the time between refreshes for the portion of the memory device; and a high voltage selection circuit to selectively provide an overcharge voltage to the portion of the memory device to overcharge the portion of the memory device in response to a control signal from the control logic.

In one embodiment, the control logic is to determine that the time between refreshes is too short because the memory device is in a low power state. In one embodiment, the control logic is to determine that the time between refreshes is too short because the portion of the memory device stores data designated to have a longer time between refreshes. In one embodiment, the control logic is to generate control signals to overcharge the portion of the memory device, but not another portion of the same memory device. In one embodiment, the control logic is part of a memory controller associated with the memory device. In one embodiment, the control logic is part of the memory device. In one embodiment, the control logic is to generate control signals to set a time between refreshes for auto refresh operations. In one embodiment, the high voltage selection circuit is to selectively provide one of multiple different levels of overcharge refresh voltage.

In one aspect, a system includes: a refresh voltage control circuit, including control logic to detect that a portion of a memory device needs to be refreshed, determine that a time between refreshes is too short for a state of the portion of the memory device, and generate control signals to circuits that control refresh to cause the circuits to overcharge the portion of the memory device with a refresh operation to extend the time between refreshes for the portion of the memory device; and a high voltage selection circuit to selectively provide an overcharge voltage to the portion of the memory device to overcharge the portion of the memory device in response to a control signal from the control logic; and a high-definition display coupled to generate a display based on data stored in the memory device.

In one embodiment, the control logic is to determine that the time between refreshes is too short because the memory device is in a low power state. In one embodiment, the control logic is to determine that the time between refreshes is too short because the portion of the memory device stores data designated to have a longer time between refreshes. In one embodiment, the control logic is to generate control signals to overcharge the portion of the memory device, but not another portion of the same memory device. In one embodiment, the control logic is part of a memory controller associated with the memory device. In one embodiment, the control logic is part of the memory device. In one embodiment, the control logic is to generate control signals to set a time between refreshes for auto refresh operations. In one embodiment, the high voltage selection circuit is to selectively provide one of multiple different levels of overcharge refresh voltage.

In one aspect, an article of manufacture comprising a computer readable storage medium having content stored thereon, which when executed performs operations for managing memory device refresh, including: detecting that a portion of a memory device needs to be refreshed, the memory device having an associated time between refreshes; determining that the time between refreshes is too short for a state of the portion of the memory device; and applying an overcharge refresh to overcharge the portion of the memory device with a refresh operation to extend the time between refreshes for the portion of the memory device.

In one embodiment, the content for determining that the time between refreshes is too short for the state comprises content for determining that the memory device is in a low power state. In one embodiment, the content for determining that the time between refreshes is too short for the state comprises content for determining that the portion of the memory device stores data designated to have a longer time between refreshes. In one embodiment, the content for applying the overcharge refresh for the portion of the memory device comprises content for applying the overcharge refresh for the portion of the memory device, but not for another portion of the same memory device. In one embodiment, the content for applying the overcharge refresh further comprises content for sending an overcharge refresh command from a memory controller to the memory device, wherein the memory device receives an external overcharge refresh voltage for the refresh operation. In one embodiment, the content for applying the overcharge refresh further comprises content for sending an overcharge refresh command from a memory controller to the memory device, wherein the memory device generates an overcharge refresh voltage for the refresh operation. In one embodiment, the content for applying the overcharge refresh for the portion of the memory device further comprises content for setting time between refreshes for auto refresh operations. In one embodiment, the content for applying the overcharge refresh for the portion of the memory device further comprises content for performing the refresh operation with one of multiple different levels of overcharge refresh voltage.

In one aspect, an apparatus for managing memory device refresh includes: means for detecting that a portion of a memory device needs to be refreshed, the memory device having an associated time between refreshes; means for determining that the time between refreshes is too short for a state of the portion of the memory device; and means for applying an overcharge refresh to overcharge the portion of the memory device with a refresh operation to extend the time between refreshes for the portion of the memory device.

In one embodiment, the means for determining that the time between refreshes is too short for the state comprises means for determining that the memory device is in a low power state. In one embodiment, the means for determining that the time between refreshes is too short for the state comprises means for determining that the portion of the memory device stores data designated to have a longer time between refreshes. In one embodiment, the means for applying the overcharge refresh for the portion of the memory device comprises means for applying the overcharge refresh for the portion of the memory device, but not for another portion of the same memory device. In one embodiment, the means for applying the overcharge refresh further comprises means for sending an overcharge refresh command from a memory controller to the memory device, wherein the memory device receives an external overcharge refresh voltage for the refresh operation. In one embodiment, the means for applying the overcharge refresh further comprises means for sending an overcharge refresh command from a memory controller to the memory device, wherein the memory device generates an overcharge refresh voltage for the refresh operation. In one embodiment, the means for applying the overcharge refresh for the portion of the memory device further comprises means for setting time between refreshes for auto refresh operations. In one embodiment, the means for applying the overcharge refresh for the portion of the memory device further comprises means for performing the refresh operation with one of multiple different levels of overcharge refresh voltage.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A method for managing memory device refresh, comprising:
    detecting that a portion of a memory device needs to be refreshed, the memory device having an associated time between refreshes;
    determining whether the time between refreshes is too short for a state of the portion of the memory device; and
    if the time between refreshes is too short for the state, applying an overcharge refresh with an overcharge voltage to the portion of the memory device with a refresh operation to selectively extend the time between refreshes for the portion of the memory device; otherwise,
    applying a refresh operation with a refresh voltage that does not extend the time between refreshes for the portion of the memory device.

2. The method of claim 1, wherein determining that the time between refreshes is too short for the state comprises determining that the memory device is in a low power state.

3. The method of claim 1, wherein determining that the time between refreshes is too short for the state comprises determining that the portion of the memory device stores data designated to have a longer time between refreshes.

4. The method of claim 1, wherein applying the overcharge refresh for the portion of the memory device comprises applying the overcharge refresh for the portion of the memory device, but not for another portion of the same memory device.

5. The method of claim 1, wherein applying the overcharge refresh further comprises sending an overcharge refresh command from a memory controller to the memory device, wherein the memory device receives an external overcharge refresh voltage for the refresh operation.

6. The method of claim 1, wherein applying the overcharge refresh further comprises sending an overcharge refresh command from a memory controller to the memory device, wherein the memory device generates an overcharge refresh voltage for the refresh operation.

7. The method of claim 1, wherein applying the overcharge refresh for the portion of the memory device further comprises setting time between refreshes for auto refresh operations.

8. The method of claim 1, wherein applying the overcharge refresh for the portion of the memory device further comprises performing the refresh operation with one of multiple different levels of overcharge refresh voltage.

9. An apparatus for dynamically applying a refresh voltage, comprising:
    control logic to detect that a portion of a memory device needs to be refreshed, determine whether a time between refreshes is too short for a state of the portion of the memory device, and if the time between refreshes is too short for the state, generate control signals to circuits that control refresh to cause the circuits to apply an overcharge refresh to overcharge the portion of the memory device with a refresh operation having an overcharge voltage to the portion of the memory device with a refresh operation to selectively extend the time between refreshes for the portion of the memory device; otherwise, to apply a refresh operation with a refresh voltage that does not extend the time between refreshes for the portion of the memory device; and
    a high voltage selection circuit to selectively provide an overcharge voltage to the portion of the memory device to overcharge the portion of the memory device in response to a control signal from the control logic.

10. The apparatus of claim 9, wherein the control logic is to determine that the time between refreshes is too short because the memory device is in a low power state.

11. The apparatus of claim 9, wherein the control logic is to determine that the time between refreshes is too short because the portion of the memory device stores data designated to have a longer time between refreshes.

12. The apparatus of claim 9, wherein the control logic is to generate control signals to overcharge the portion of the memory device, but not another portion of the same memory device.

13. The apparatus of claim 9, wherein the control logic is part of a memory controller associated with the memory device.

14. The apparatus of claim 9, wherein the control logic is part of the memory device.

15. The apparatus of claim 9, wherein the control logic is to generate control signals to set a time between refreshes for auto refresh operations.

16. The apparatus of claim 9, wherein the high voltage selection circuit is to selectively provide one of multiple different levels of overcharge refresh voltage.

17. A system comprising:
    a refresh voltage control circuit, including
        control logic to detect that a portion of a memory device needs to be refreshed, determine whether a time between refreshes is too short for a state of the portion of the memory device, and if the time between refreshes is too short for the state, generate control signals to circuits that control refresh to cause the circuits to apply an overcharge refresh to overcharge the portion of the memory device with a refresh operation having an overcharge voltage to the portion of the memory device with a refresh operation to selectively extend the time between refreshed for the portion of the memory device; otherwise, to apply a refresh operation with a refresh voltage that does not extend the time between refreshes for the portion of the memory device; and a high voltage selection circuit to selectively provide an overcharge voltage to the portion of the memory device to overcharge the portion of the memory device in response to a control signal from the control logic; and a high-definition display coupled to generate a display based on data stored in the memory device.

18. The system of claim 17, wherein the control logic is to determine that the time between refreshes is too short because the memory device is in a low power state or because the portion of the memory device stores data designated to have a longer time between refreshes.

19. The system of claim 17, wherein the control logic is to generate control signals to overcharge the portion of the memory device, but not another portion of the same memory device.

20. The system of claim 17, wherein the high voltage selection circuit is to selectively provide one of multiple different levels of overcharge refresh voltage.

* * * * *